United States Patent [19]

Kitamura et al.

[11] Patent Number: 5,051,803
[45] Date of Patent: Sep. 24, 1991

[54] DIODE AND PRODUCING METHOD THEREOF AND CONTACT IMAGE SENSOR DEVICE COMPRISING THE SAME

[75] Inventors: Koichi Kitamura; Hidenori Mimura; Kazuo Yamamoto; Yasumitsu Ohta; Kazuyoshi Sai; Kazuhiko Kawamura; Noboru Otani, all of Kawasaki, Japan

[73] Assignee: Nippon Steel Corporation, Tokyo, Japan

[21] Appl. No.: 543,108

[22] Filed: Jun. 25, 1990

[30] Foreign Application Priority Data

Jun. 30, 1989 [JP] Japan ................................ 1-169049

[51] Int. Cl.[5] .................. H01L 45/00; H01L 27/14; H01L 31/00; H01L 29/12
[52] U.S. Cl. ............................................ 357/30; 357/2; 357/58
[58] Field of Search .......................... 357/2, 30, 58

[56] References Cited

U.S. PATENT DOCUMENTS

| | | | |
|---|---|---|---|
| 4,409,605 | 10/1983 | Ovshinsky et al. | 357/2 |
| 4,678,731 | 7/1987 | Yoshizawa et al. | 430/65 |
| 4,713,308 | 12/1987 | Yoshizawa et al. | 430/65 |
| 4,775,425 | 10/1988 | Guha et al. | 357/2 |
| 4,785,186 | 11/1988 | Street et al. | 250/370.14 |
| 4,799,094 | 1/1989 | Rougeot | 357/30 |

OTHER PUBLICATIONS

Y. Uchida et al., "Microcrystalline Si: H Film and Its Application to Solar Cells" 586–588 Japanese Journal of Applied Physics, vol. 21, No. 9, Sep. 1982.

F. Morin et al., "Polycrystalline Silicon by Glow Discharge Technique" 686–687 Appl. Phys. Letters, 35 No. 9, Nov. 1979.

Y. Osaka et al., "Microcrystalline Silicon ($\mu$c-Si) Prepared by Plasma-Chemical Techniques" 80–91 JARECT vol. 16, Amorphous Semiconductor Technologies & Devices 1984.

Primary Examiner—Andrew J. James
Assistant Examiner—Stephen D. Meier
Attorney, Agent, or Firm—Spencer & Frank

[57] ABSTRACT

A pin diode having an incident layer which includes 1 to 10% of microcrystallized silicon is formed in a condition where a molar ratio of hydrogen to monosilane is 5:1 to 100:1 and applied power is 0.001 to 0.05 W/cm². The pin diode as well as a contact image sensor comprising the same as excellent photoelectric transfer efficiency.

20 Claims, 3 Drawing Sheets

DIODE AND PRODUCING METHOD THEREOF AND CONTACT IMAGE SENSOR DEVICE COMPRISING THE SAME

BACKGROUND OF THE INVENTION

1. Field of the Invention

This invention relates to a diode, more particularly, a pin diode for transducing incident rays to an electrical signal, a producing method thereof, and a contact image sensor device comprising the same for sensing an image of objects.

2. Description of the Related Art

In a pin diode, if a part of an incident layer, e.g., an n layer, is microcrystallized, the n layer would have a higher optical transparency and improved light sensitivity, and would have a higher electrical conductivity due to a lower electrical resistance of a microcrystalline silicon than that of a hydrogenated amorphous silicon, and therefore the diode characteristics of the pin diode would be improved (Y. Uchida, et al., "Microcrystalline Si-H Film and Its Application to Solar Cells", Japanese Journal of Applied Physics, vol. 21, No. 9, 1982, pp 586–588).

Accordingly, the aforementioned pin diode and a contact image sensor device comprising this pin diode could have improved conversion efficiency in a photoelectric conversion.

A method for microcrystallizing the incident side of a pin diode, e.g., the n layer, wherein a temperature of a deposited substrate Ts is kept between 500° C. and 600° C. during deposition of each layer, is described in "F. Morin, et al., Polycrystalline silicon by glow discharge technique, Applied Physics Letters, vol. 35, No. 9, 1979, pp. 686–687". According to this method, the n layer does not become hydrogenated amorphous silicon, but becomes a microcrystallized amorphous silicon. However, since hydrogen included in the hydrogenated amorphous silicon in a p layer and an i layer is missing in aforementioned high substrate temperature Ts, defects in the hydrogenated amorphous silicon are remarkably increased and the diode characteristics (e.g., rising characteristics of ON current in a forward direction and a leakage current value in a reverse direction) of the pin diode are remarkably degraded.

A deposition method, in order to microcrystallize a whole layer at a low deposition substrate temperature Ts of about 250° C. which is a usual deposition temperature of hydrogenated amorphous silicon, is described in "Y. Osaka, et al., Microcrystalline Silicon ($\mu$c-Si) Prepared by Plasma-Chemical Techniques, JARECT vol. 16, Amorphous Semiconductor Technologies & Devices, 1984, pp 80–91". In this method, high power (e.g., more than about 0.2 W/cm$^2$) is applied between an anode and a cathode in a reaction vessel and monosilane supplied as a raw gas is diluted with hydrogen (e.g., hydrogen:mono-silane =1:1). According to this method, since a depositing surface of the layer is covered with hydrogen and high power is supplied, microcrystallization is facilitated. However, the aforementioned high power damages the i layer which is a lower layer, and therefore the diode characteristics are remarkably degraded.

SUMMARY OF THE INVENTION

It is an object of the present invention to provide a diode having improved diode characteristics and improved photoelectric conversion efficiency (especially blue-sensitivity).

It is another object of the present invention to provide a method for producing the aforementioned diode.

It is still another object of the present invention to provide a contact image sensor device comprising the aforementioned diode.

In accordance with the present invention, there is provided a diode having an incident layer which includes 1 to 10% of microcrystallized silicon.

In accordance with the present invention, there is also provided a contact image sensor device comprising a plurality of diodes each having an incident layer which includes 1 to 10% of microcrystallized silicon.

In accordance with the present invention, there is further provided a method for producing a diode comprising the step of forming an incident layer in a condition where a molar ratio of hydrogen to monosilane as raw gases is 5:1 to 100:1 and an applied power between an anode and a cathode is 0.001 to 0.05 W/cm$^2$.

DESCRIPTION OF THE PREFERRED EMBODIMENTS

Figure 1:
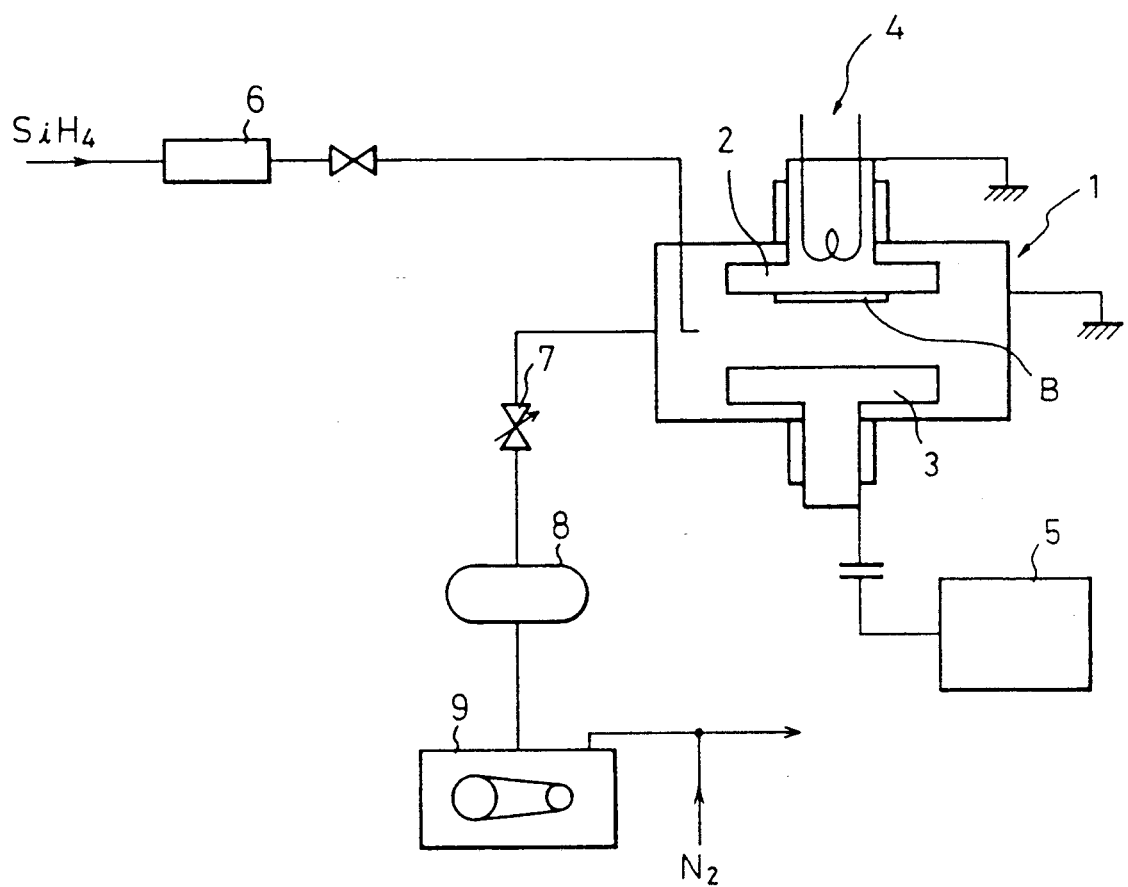
FIG. 1 is a schematic diagram of an amorphous silicon growing apparatus for forming a pin diode according to the present invention.
Figure 2:
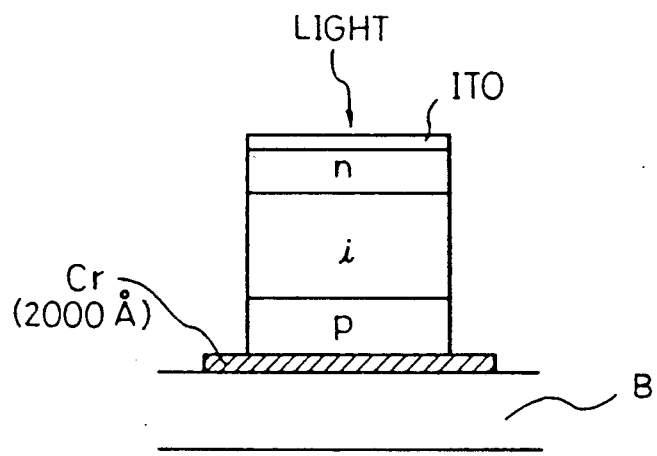
FIG. 2 is a cross-sectional view of an example of a pin diode according to the present invention.
Figure 3:
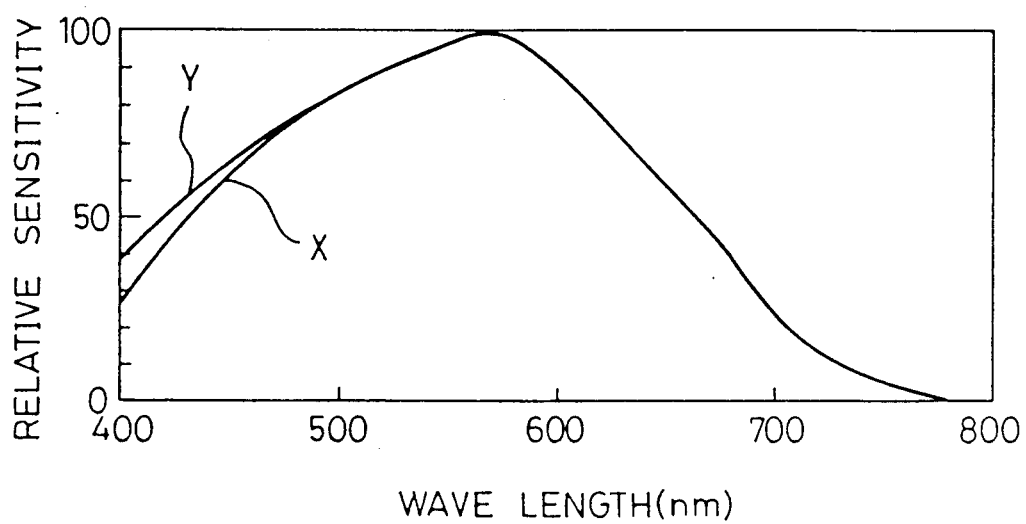
FIG. 3 is a diagram showing spectral sensitivity characteristics of the pin diode according to the present invention.

An embodiment of the present invention is described referring to FIG. 1 to FIG. 3.

FIG. 1 is a schematic diagram of an amorphous silicon growing apparatus for forming a pin diode according to the present invention. In the growing apparatus shown in FIG. 1, a thin layer of an amorphous silicon is deposited by dissociating mono-silane (SiH$_4$) gas with a glow discharge. In FIG. 1, the reference numeral 1 denotes a reaction vessel. An anode 2 and a cathode 3 are provided within the reaction vessel and the anode is provided with a heater 4. The reference numeral 5 denotes a high frequency power source for supplying electric power between the anode 2 and the cathode 3 to generate a discharge having a high frequency. Mono-silane (SiH$_4$) gas is supplied through a flow controller 6 into the reaction vessel 1. The reaction vessel 1 is evacuated through a throttle valve 7 by a diffuser pump 8 and a rotary pump 9.

Using the aforementioned growing apparatus, a pin diode was formed placing a substrate B on the anode 2 under conditions that the molar ratio of hydrogen to monosilane was 20:1, power supplied between the anode 2 and the cathode 3 was 0.01 W/cm$^2$, and a pressure inside the reaction vessel 1 was 0.3 Torr. The substrate temperature was about 250° C. which is a usual temperature in depositing hydrogenated amorphous silicon.

Concerning the molar ratio of the raw gases, as the content of hydrogen is increased, the content of microcrystalline structure increases. However, if the molar ratio of hydrogen to monosilane is more than 100:1, the deposition rate is remarkably reduced, so that the process is not practical. Conversely, if the molar ratio of hydrogen to monosilane is less than 5:1, high power is required. If the applied power is less than 0.01 W/cm$^2$, the deposition rate is reduced, so that the process is not practical. Conversely, if the the applied power is more than 0.05 W/cm$^2$, the lower layer is damaged.

A pin diode according to the present invention formed under the aforementioned conditions comprises an n layer as an incident layer having a thickness of 300 Å, a p layer having a thickness of 300 Å, an i layer having a thickness of 6000 Å, and an ITO layer having a thickness of 650 Å. The content of microcrystalline structure in the n layer becomes about 10% of the amorphous silicon. The value has been confirmed from X-ray diffraction or reflection electron beam diffraction. In FIG. 2, ITO is a transparent metal membrane and Cr is a chrome membrane (2000 Å) formed on the substrate B. FIG. 3 shows spectral sensitivity characteristics of the pin diode. The curve X represents the characteristics of a pin diode whose n layer was formed while the molar ratio of the raw gas was 0 (H$_2$/SiH$_4$ =0). The curve Y represents the characteristics of the pin diode whose n layer was formed while the molar ratio of the raw gas was 20 (H$_2$/SiH$_4$ =20). As apparent from FIG. 3, the pin diode according to the present invention has higher blue sensitivity. This means that the n layer has higher optical transparency.

Figure 4:
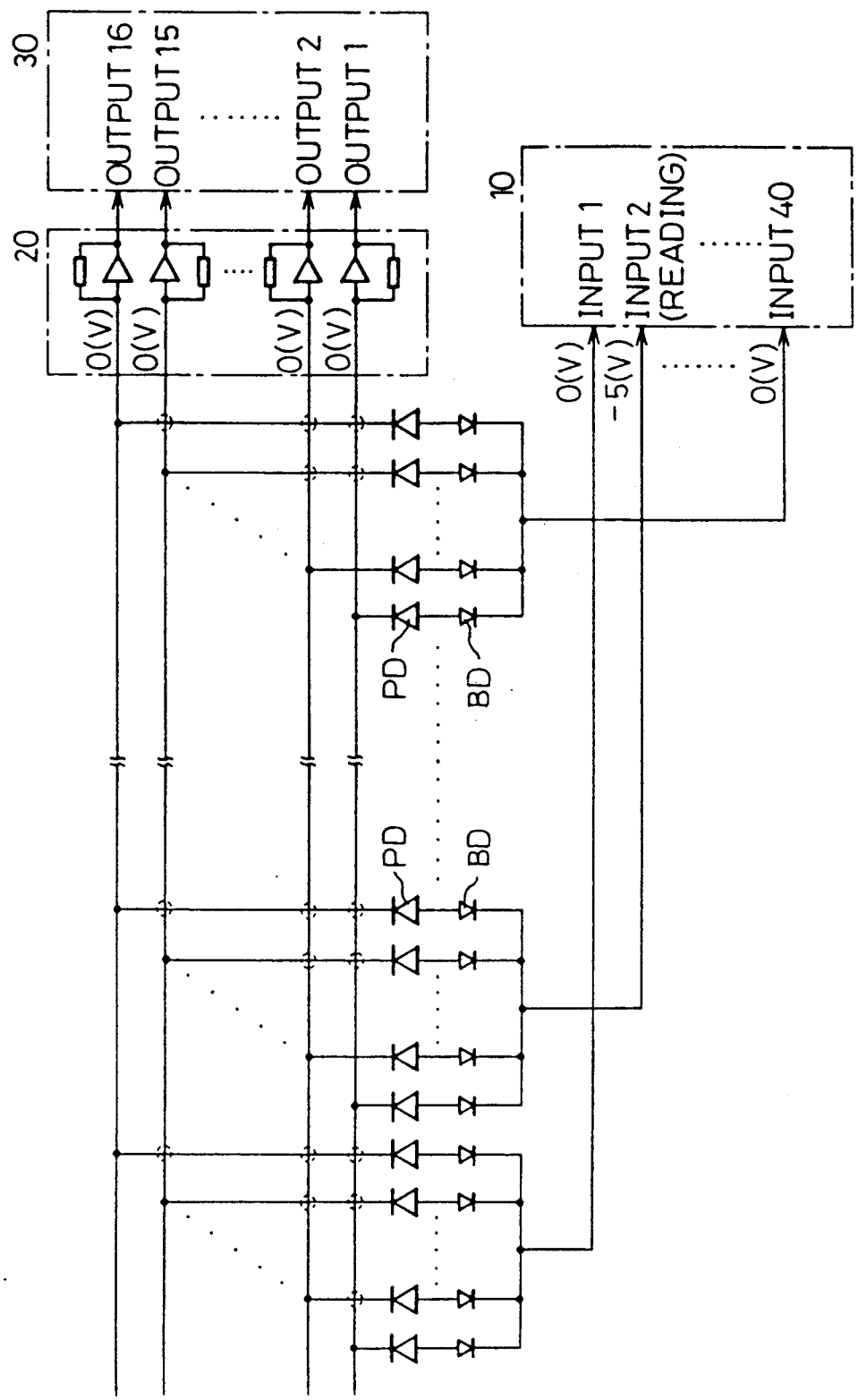
FIG. 4 is a circuit diagram of an example of a contact image sensor device employing the pin diode as a photodiode.

FIG. 4 is a circuit diagram of a contact image sensor device according to the present invention, employing the pin diode having aforementioned characteristics, as a photodiode. PD is a photodiode, BD is a blocking diode, 10 is a control and driving part, 20 is an amplifying part, and 30 is a reading part. The control and driving part 10 provides the blocking diodes BD with a −5 V pulse information stored in the photodiode PD and maintains the potential of the cathode of the blocking diodes BD when storing the information. The reading part 30 reads the information sent from the photodiodes PD through the amplifying part 20. The contact image sensor device shown in FIG. 4 has 640 pixels connected in a matrix. Driving and reading the pixels are successively performed by 40 input channels in the control and driving part 10 and by 16 output blocks in the reading part 30. The inventors measured characteristics of the contact image sensor device by providing 40 shift registers on the input side and 16 OP-amps on the output side and by rapidly driving for 1.0 msec per 1 line an 80 mm length sensor (width of an input pulse is about 24 μsec). The measured S/N ratio was more than 30 dB, which is a satisfactory result.

As mentioned above, in accordance with the present invention, while an incident layer of a pin diode is deposited by dissociating monosilane gas with a glow discharge technique, the deposition rate is not so remarkably reduced and other layers are not damaged by supplying power. Therefore, a pin diode wherein photoelectric transfer efficiency can be improved without degrading diode characteristics, and a contact image sensor device comprising the same, can be provided.

We claim:

1. A photoelectric conversion element comprising:
   an i-type semiconductor layer of amorphous silicon; and
   an incident n-type semiconductor layer of amorphous silicon provided on said i-type semiconductor layer, said n-type semiconductor layer including 1 to 10% microcrystallized silicon.

2. A photoelectric conversion element as claimed in claim 1, further comprising a p-type semiconductor layer, said i-type semiconductor layer being provided on said p-type semiconductor layer.

3. A photoelectric conversion element as claimed in claim 2, further comprising a conductive layer, said p-type semiconductor layer being provided on said conductive layer.

4. A photoelectric conversion element as claimed in claim 3, further comprising a substrate, said conductive layer being provided on said substrate.

5. A photoelectric conversion element as claimed in claim 3, wherein said conductive layer is a chrome membrane.

6. A photoelectric conversion element comprising:
   an i-type semiconductor layer of amorphous silicon; and
   an incident p-type semiconductor layer of amorphous silicon provided on said i-type semiconductor layer, said p-type semiconductor layer including 1 to 10% microcrystallized silicon.

7. A photoelectric conversion element as claimed in claim 6, further comprising an n-type semiconductor layer, said i-type semiconductor layer being provided on said n-type semiconductor layer.

8. A photoelectric conversion element as claimed in claim 7, further comprising a conductive layer, said n-type semiconductor layer being provided on said conductive layer.

9. A photoelectric conversion element as claimed in claim 8, further comprising a substrate, said conductive layer being provided on said substrate.

10. A photoelectric conversion element as claimed in claim 9, wherein said conductive layer is a chrome membrane.

11. A diode comprising:
    a conductive layer;
    a p-type semiconductor layer of amorphous silicon provided on said conductive layer;
    an i-type semiconductor layer of amorphous silicon provided on said p-type semiconductor layer; and
    an incident n-type semiconductor layer of amorphous silicon provided on said i-type semiconductor layer, said n-type semiconductor layer including 1 to 10% microcrystallized silicon.

12. A diode as claimed in claim 11, further comprising an ITO layer provided on said n-type semiconductor layer.

13. A diode as claimed in claim 11, further comprising a substrate, said conductive layer being provided on said substrate.

14. A diode as claimed in claim 11, wherein said conductive layer is a chrome membrane.

15. A contact image sensor device, including a plurality of diodes each as claimed in claim 11.

16. A diode comprising:
    a conductive layer;
    an n-type semiconductor layer of amorphous silicon provided on said conductive layer;
    an i-type semiconductor layer of amorphous silicon provided on said n-type semiconductor layer; and
    a incident p-type semiconductor layer of amorphous silicon provided on said i-type semiconductor layer, said p-type semiconductor layer including 1 to 10% microcrystallized silicon.

17. A diode as claimed in claim 16, further comprising an ITO layer provided on said p-type semiconductor layer.

18. A diode as claimed in claim 16, further comprising a substrate, said conductive layer being provided on said substrate.

19. A diode as claimed in claim 16, wherein said conductive layer is a chrome membrane.

20. A contact image sensor device, including a plurality of diodes each as claimed in claim 16.

* * * * *